United States Patent [19]
Rath et al.

[11] Patent Number: 5,965,465
[45] Date of Patent: Oct. 12, 1999

[54] ETCHING OF SILICON NITRIDE

[75] Inventors: David L. Rath, Stormville, N.Y.; Rangarajan Jagannathan, South Burlington, Vt.; Kenneth J. McCullough, Fishkill, N.Y.; Harald F. Okorn-Schmidt, Putnam Valley, N.Y.; Karen P. Madden, Poughquag, N.Y.; Keith R. Pope, Danbury, Conn.

[73] Assignee: International Business Machines Corporation, Armonk, N.Y.

[21] Appl. No.: 08/932,865

[22] Filed: Sep. 18, 1997

[51] Int. Cl.$^6$ .......................... H01L 21/02; H01L 21/306
[52] U.S. Cl. .......................... 438/745; 438/757; 252/79.1
[58] Field of Search .................... 438/689, 724, 438/745, 757; 252/79.1

[56] References Cited

U.S. PATENT DOCUMENTS

| | | | |
|---|---|---|---|
| 3,676,240 | 7/1972 | Retajczyk | 156/17 |
| 3,979,241 | 9/1976 | Maeda et al. | 438/637 |
| 4,230,523 | 10/1980 | Gajda | 438/756 |
| 4,267,013 | 5/1981 | Iida et al. | 156/643 |
| 4,285,763 | 8/1981 | Coldren | 156/643 |
| 4,325,981 | 4/1982 | Galfo et al. | 427/38 |
| 4,334,349 | 6/1982 | Aoyama et al. | 438/670 |
| 4,351,696 | 9/1982 | Radigan | 156/643 |
| 4,395,304 | 7/1983 | Kern et al. | 156/657 |
| 4,444,618 | 4/1984 | Saia et al. | 156/643 |
| 4,472,237 | 9/1984 | Deslauriers et al. | 156/643 |
| 4,547,260 | 10/1985 | Takada et al. | 156/643 |
| 4,692,205 | 9/1987 | Sachdev et al. | 156/643 |
| 4,899,797 | 2/1990 | McConnell et al. | 134/56 R |
| 4,962,049 | 10/1990 | Chang et al. | 437/13 |
| 4,971,715 | 11/1990 | Armant et al. | 252/143 |
| 4,985,113 | 1/1991 | Fujimoto et al. | 156/643 |
| 4,985,990 | 1/1991 | Cronin et al. | 29/852 |
| 4,987,101 | 1/1991 | Kaanta et al. | 437/228 |
| 5,012,692 | 5/1991 | Ide et al. | 437/241 |
| 5,037,506 | 8/1991 | Gupta et al. | 156/646 |
| 5,082,518 | 1/1992 | Molinaro | 156/345 |
| 5,139,624 | 8/1992 | Searson et al. | 204/129.3 |
| 5,217,570 | 6/1993 | Kadomura | 156/665 |
| 5,308,440 | 5/1994 | Chino et al. | 156/664 |
| 5,334,332 | 8/1994 | Lee | 252/548 |
| 5,338,416 | 8/1994 | Mlcak et al. | 204/129.3 |
| 5,348,619 | 9/1994 | Bohannon et al. | 156/664 |
| 5,348,627 | 9/1994 | Propst et al. | 204/129.3 |
| 5,350,488 | 9/1994 | Webb . | |
| 5,387,361 | 2/1995 | Kohara et al. | 252/79.1 |
| 5,407,860 | 4/1995 | Stoltz et al. | 437/180 |
| 5,419,779 | 5/1995 | Ward | 134/38 |
| 5,431,766 | 7/1995 | Propst et al. | 156/345 |
| 5,461,033 | 10/1995 | Havemann et al. | 437/187 |
| 5,468,342 | 11/1995 | Nulty et al. | 156/643.1 |
| 5,475,267 | 12/1995 | Ishii et al. | 257/752 |
| 5,533,635 | 7/1996 | Man | 216/67 |
| 5,544,776 | 8/1996 | Okuda et al. | 216/83 |
| 5,556,482 | 9/1996 | Ward et al. | 134/38 |
| 5,571,447 | 11/1996 | Ward et al. | 510/206 |
| 5,591,299 | 1/1997 | Seaton et al. | 156/626.1 |
| 5,650,041 | 7/1997 | Gotoh et al. | 156/653.1 |
| 5,698,503 | 12/1997 | Ward et al. | 510/176 |
| 5,709,756 | 1/1998 | Ward et al. | 134/1.3 |
| 5,780,363 | 5/1981 | Deckert et al. | 438/756 |

FOREIGN PATENT DOCUMENTS

| | | | |
|---|---|---|---|
| 238622 | 8/1986 | German Dem. Rep. | C09K 13/08 |
| 58-143532 | 8/1983 | Japan | H01L 21/30 |
| WO 97/02958 | 1/1997 | WIPO . | |

OTHER PUBLICATIONS

Anon, Flush Fluids for Ink Jet Ink Devices, *Research Disclosure,* Jan. 1991, No. 321.

"Etching SiO$_2$ Films In Aqueous 0.49% HF", Somashekhar et al, *J. Electrochem. Soc.,* vol. 143, No. 9, pp. 2885–2891, Sep. 1996.

El–Kareh, B., Fundamentals of Semiconductor Processing Technologies, Kluwer Academic Publishers, Norwell, MA, 1995: 565–571.

*Primary Examiner*—Benjamin Utech
*Assistant Examiner*—Lynette T. Umez-Eronini
*Attorney, Agent, or Firm*—Pollock, Vande Sandle & Amernick; Jay Anderson

[57] ABSTRACT

Silicon nitride is etched employing a composition containing a fluoride containing compound, certain organic solvents, and water.

17 Claims, No Drawings

ETCHING OF SILICON NITRIDE

TECHNICAL FIELD

The present invention is concerned with etching silicon nitride and particularly etching silicon nitride at a rate at least as fast as that for silicon dioxide. In addition, the present invention is concerned with certain etching compositions that are suitable for etching silicon nitride at a rate at least as fast as that for silicon dioxide.

BACKGROUND ART

In the fabrication of microelectronic components, a number of the steps involved, for instance, in preparing integrated circuit chips and the packaging for the chips (articles to which the chips are attached and protected), are etching processes. Accordingly, over the years, a number of vastly different types of etching processes to remove material, sometimes in selective areas, have been developed and are utilized to varying degrees. Moreover, the steps of etching different layers which constitute, for instance, the finished integrated circuit chip are among the most critical and crucial steps.

One method widely employed for etching is to overlay the surface to be etched with a suitable mask and then immerse the surface and mask in a chemical solution which attacks the surface to be etched, while leaving the mask intact and while only etching other materials of the article to at most, a minimum extent.

In many structures, a silicon nitride layer exists on top or beneath a silicon dioxide layer and it becomes necessary to etch the silicon nitride without overetching the silicon dioxide. The ability to use a fluoride such as hydrogen fluoride in such situation presents a problem since hydrogen fluoride etches silicon dioxide at a much faster rate than it does silicon nitride. It would therefore be desirable to provide an etching procedure that achieves excellent removal of the silicon nitride and especially a procedure that exhibits an etching rate for silicon nitride that is at least as fast as the rate for silicon dioxide.

SUMMARY OF INVENTION

The present invention is concerned with a method for etching silicon nitride. The process of the present invention comprises contacting an article that contains silicon nitride and silicon dioxide with an etching composition that contains about 0.1 to about 3 molar of a fluoride containing compound, an organic solvent and about 0.1 to about 4 molar of water to thereby etch the silicon nitride at a rate at least as fast as the rate for the silicon dioxide.

In addition, the present invention is concerned with certain preferred etching compositions that are capable of etching silicon nitride at a rate at least as fast as the rate for silicon oxides. The preferred compositions of the present invention contain about 0.1 to about 3 molar of a fluoride containing compound, an organic solvent, and about 0.1 to about 4 molar of water.

The organic solvents employed in the present invention typically have relatively high flash point and provide low viscosity compositions. Suitable solvents include sulfolanes, oxolanes, esters, ketones, aldehydes, lactones, halogenated hydrocarbons, monohydric alcohols, amines and imides.

Other objects and advantages of the present invention will become readily apparent to those skilled in this art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BEST AND VARIOUS MODES FOR CARRYING OUT INVENTION

The present invention is concerned with etching a silicon nitride. Moreover, the silicon nitride is present in an article that also includes silicon dioxide, wherein both the silicon nitride and silicon dioxide will come in contact with the etching composition. The present invention provides for etching the silicon nitride at a rate at least as fast as the rate for silicon dioxide and preferably at a rate greater than that for silicon dioxide and most preferably at a rate at least about 10 percent greater.

The silicon dioxide is preferably high density silicon dioxide. High density silicon dioxide refers to thermally grown silicon dioxide or silicon dioxide that is chemically vapor deposited (CVD) or physically vapor deposited (PVD) followed by thermal annealing.

The etching compositions employed pursuant to the present invention contain a compound containing fluoride and an organic solvent. The amount of the fluoride containing compound in the composition is about 0.1 to about 3 molar, and preferably about 0.15 to about 1.5 molar, and most preferably about 0.2 to about 1 molar.

Typical compounds providing a fluoride source according to the present invention are hydrofluoric acid, ammonium fluoride, fluoroborates, fluoroboric acid, tin bifluoride, antimony fluoride, tetrabutylammonium tetrafluoroborate, and aluminum hexafluoride. Also, a fluoride salt of an aliphatic primary, secondary or tertiary amine can be used. Such have the following formula:

wherein $R_1$, $R_2$ and $R_3$ each individually represent H or an alkyl group.

Typically, the total number of carbon atoms in the $R_1$, $R_2$ and $R_3$ groups is 12 carbon atoms or less. The preferred fluoride compounds are hydrogen fluoride and ammonium fluoride.

The hydrogen fluoride is typically employed as a 49 weight percent aqueous solution.

Examples of suitable organic compounds include oxolanes, sulfolanes, esters, ketones, aldehydes, lactones, halogenated solvents, amines, imides and monohydric alcohols. Examples of suitable esters are esters of carbonic acids, benzoic acid, phthalic acid, isophthalic acid and terephthalic acid, and especially the $C_1$–$C_6$ alkyl esters. Preferred organic solvents are propylene carbonate, N-methyl pyrrolidone, gamma butyrolactone, methylene chloride, benzyl alcohol, N-formyl morpholine, N-formyl piperidine, cyclohexanone, cyclopentanone, methyl benzoate, diglyme, 2-methyl tetrahydrofuran, and methyl and ethyl esters of phthalic, isophthalic or terephthalic acids. The more preferred solvents employed pursuant to the present invention are propylene carbonate, N-methylpyrrolidone and gamma butyrolactone, with propylene carbonate being the most preferred.

Organic solvents employed in the present invention provide for low viscosity compositions, which in turn render the compositions more workable and providing for better etch uniformity. This is especially so when compared to using polyhydric alcohols such as glycerol and ethylene glycol.

The compositions according to the present invention also include water. Typically, the water is employed in an amount of about 0.1 to about 4 molar, preferably about 0.15 to about 2 molar, and most preferably about 0.2 to about 1.5 molar.

The etching process of the present invention is typically carried out at temperatures of about 20° C. to about 90° C., and preferably about 30° C. to about 70° C. The temperature employed is directly dependent upon the fluoride concentration. In particular, as the fluoride concentration increases, it becomes necessary to also increase the temperature in order to achieve the desired etching rate of the silicon nitride in comparison to that for the silicon dioxide. For instance, at a fluoride concentration of 0.25 molar, to achieve an etch rate for the silicon nitride that is as fast as that for the silicon dioxide, the temperature is about 55° C.; whereas, at a concentration of 1.5 molar, the temperature is about 70° C. The minimum temperature to use for any specific fluoride concentration can be determined without undue experimentation by those skilled in the art once aware of this disclosure.

The ability to use fluoride to etch silicon nitride at a rate equal to or greater than that for silicon dioxide is surprising in view of the prior experience with hydrogen fluoride in etching silicon dioxide at a much higher rate than that for silicon nitride.

The following non-limiting examples are presented to further illustrate the present invention.

EXAMPLE 1

An etching composition is prepared by admixing one part by volume of a 49 percent by weight aqueous solution of HF with about 112 parts by volume of propylene carbonate to provide a 0.25 molar HF solution in propylene carbonate. A blanket silicon wafer having a layer thermally grown silicon dioxide beneath a layer of silicon nitride is contacted with the etching composition. The article contains deep trenches thereby exposing the walls of the underlying silicon dioxide layer to the etchant. The etching is carried out at a temperature of about 60° C. for about 20 minutes. The etching solution etches the silicon nitride at a rate of about 0.42 nanometers/minute and the silicon dioxide at a rate of about 0.36 nanometers/minute, resulting in a selectivity of silicon nitride etching relative to the silicon dioxide of about 1.2.

EXAMPLE 2

An etching composition is prepared by admixing one part by volume of a 49 percent by weight aqueous solution of HF with about 70 parts by volume of propylene carbonate to provide a 0.4 molar HF solution in propylene carbonate. A blanket silicon wafer having a layer thermally grown silicon dioxide beneath a layer of silicon nitride is contacted with the etching composition. The article contains deep trenches thereby exposing the walls of the underlying silicon dioxide layer to the etchant. The etching is carried out at a temperature of about 65° C. for about 11 minutes. The etching solution etches the silicon nitride at a rate of about 1.2 nanometers/minute and the silicon dioxide at a rate of about 1.0 nanometers/minute, resulting in a selectivity of silicon nitride etching relative to the silicon dioxide of about 1.2.

In this disclosure, there are shown and described only the preferred embodiments of the invention but, as aforementioned, it is to be understood that the invention is capable of use in various other combinations and environments and is capable of changes or modifications within the scope of the inventive concept as expressed herein.

What is claimed is:

1. A method for etching silicon nitride which comprises contacting an article containing said silicon nitride and a silicon dioxide with an etching composition containing about 0.1 to about 3 molar of a fluoride containing compound, an organic solvent, wherein said solvent is selected from the group consisting of propylene carbonate, N-methyl pyrrolidone, gamma butyrolactone, methylene chloride, benzyl alcohol, N-formyl morpholine, N-formyl piperidine, cyclohexanone, cyclopentanone, methyl benzoate, diglyme, 2-methyl tetrahydrofuran, methyl and ethyl esters of acid selected from the group consisting of phthalic acid, isophthalic acid and terephthalic acid and about 0.1 to about 4 molar water to thereby etch said silicon nitride at a rate at least as fast as that for said silicon dioxide.

2. The method of claim 1 wherein said organic solvent is selected from the group consisting of propylene carbonate, N-methyl pyrrolidone and gamma butyrolactone.

3. The method of claim 1 wherein said solvent is propylene carbonate.

4. The method of claim 1 wherein said fluoride containing compound is selected from the group consisting of hydrofluoric acid, ammonium fluoride, fluoroborates, tetrabutylammonium tetrafluoroborate, fluoroboric acid, aluminum hexafluoride, tin biflouride, antimony fluoride and fluoride salt of an aliphatic primary, secondary or tertiary amine.

5. The method of claim 1 wherein said fluoride containing compound is hydrofluoric acid or ammonium fluoride.

6. The method of claim 1 wherein said fluoride containing compound is hydrofluoric acid.

7. The method of claim 1 wherein said silicon dioxide is high density silicon dioxide.

8. The method of claim 7 wherein said silicon-dioxide is selected from the group consisting of thermally grown silicon dioxide, chemically vapor deposited thermally annealed silicon dioxide and physically vapor deposited thermally annealed silicon dioxide.

9. The method of claim 7 wherein said silicon dioxide is thermally grown silicon dioxide.

10. The method of claim 1 wherein the amount of water is about 0.15 to about 2 molar.

11. The method of claim 1 wherein the amount of water is about 0.2 to about 1.5 molar.

12. The method of claim 1 wherein the amount of said fluoride is about 0.15 to about 1.5 molar.

13. The method of claim 1 wherein the amount of said fluoride is about 0.2 to about 1 molar.

14. The method of claim 1 wherein the contacting with said composition is carried out at a temperature of about 20° C. to about 90° C.

15. The method of claim 1 wherein the contacting with said composition is carried out at a temperature of about 30° C. to about 70° C.

16. The method of claim 1 wherein the concentration of said fluoride and the temperature employed are such that the etch rate for said silicon nitride is greater than the etch rate for said silicon dioxide.

17. The method of claim 16 wherein the etch rate for said silicon nitride is at least about ten percent greater than for said silicon dioxide.

* * * * *